(12) United States Patent
Kim et al.

(10) Patent No.: US 12,225,710 B2
(45) Date of Patent: Feb. 11, 2025

(54) MEMORY DEVICE WITH CROSS SHAPE ACTIVE LAYER SURROUNDED BY WORD LINE

(71) Applicant: SK hynix Inc., Gyeonggi-do (KR)

(72) Inventors: Il Do Kim, Gyeonggi-do (KR); Dong Sun Sheen, Gyeonggi-do (KR); Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/524,646

(22) Filed: Nov. 30, 2023

(65) Prior Publication Data

US 2024/0098972 A1    Mar. 21, 2024

Related U.S. Application Data

(63) Continuation of application No. 17/158,756, filed on Jan. 26, 2021, now Pat. No. 11,871,556.

(30) Foreign Application Priority Data

Jul. 1, 2020    (KR) .................. 10-2020-0080872

(51) Int. Cl.
*H10B 12/00* (2023.01)
*H01L 27/12* (2006.01)
(Continued)

(52) U.S. Cl.
CPC ......... *H10B 12/30* (2023.02); *H01L 27/1222* (2013.01); *H01L 27/1225* (2013.01);
(Continued)

(58) Field of Classification Search
CPC ............. H01L 27/1222; H01L 27/1225; H01L 27/124; H01L 27/1255; H01L 29/0673; H01L 29/24; H01L 29/42392; H01L 29/7606; H01L 29/775; H01L 29/778; H01L 29/78672; H01L 29/7869; H01L 29/78696; H10B 12/03; H10B 12/05; H10B 12/30; H10B 12/482; H10B 12/488; H10B 12/50; B82Y 10/00
See application file for complete search history.

(56) References Cited

U.S. PATENT DOCUMENTS

2019/0103407 A1*  4/2019  Kim ................. H01L 28/86

FOREIGN PATENT DOCUMENTS

CN            109616474 A    4/2019
KR    10-2015-0099217 A    8/2015
(Continued)

OTHER PUBLICATIONS

Office Action for Korean Patent Application No. 10-2020-0080872 issued by the Korean Patent Office on Jul. 15, 2024.
(Continued)

*Primary Examiner* — Cheung Lee
(74) *Attorney, Agent, or Firm* — IP & T GROUP LLP

(57) ABSTRACT

A memory device includes a substrate, an active layer spaced apart from a surface of the substrate and laterally oriented in a first direction and including an opened first side, a closed second side, and a channel layer between the first side and the second side, and a word line laterally oriented in a second direction crossing the first direction while surrounding the channel layer.

10 Claims, 19 Drawing Sheets

(51) Int. Cl.
    *H01L 29/06*           (2006.01)
    *H01L 29/24*           (2006.01)
    *H01L 29/423*         (2006.01)
    *H01L 29/76*           (2006.01)
    *H01L 29/775*         (2006.01)
    *H01L 29/786*         (2006.01)

(52) U.S. Cl.
    CPC ........ *H01L 27/124* (2013.01); *H01L 27/1255* (2013.01); *H01L 29/0673* (2013.01); *H01L 29/24* (2013.01); *H01L 29/42392* (2013.01); *H01L 29/7606* (2013.01); *H01L 29/775* (2013.01); *H01L 29/78672* (2013.01); *H01L 29/7869* (2013.01); *H01L 29/78696* (2013.01); *H10B 12/03* (2023.02); *H10B 12/05* (2023.02); *H10B 12/482* (2023.02); *H10B 12/488* (2023.02); *H10B 12/50* (2023.02)

(56) References Cited

FOREIGN PATENT DOCUMENTS

| KR | 10-2019-0038223 A | 4/2019 |
| KR | 10-2019-0123163 A | 10/2019 |

OTHER PUBLICATIONS

Office Action for Chinese Patent Application No. 202110359928.9 issued by the Chinese Patent Office on Nov. 14, 2024.

\* cited by examiner

MEMORY DEVICE WITH CROSS SHAPE ACTIVE LAYER SURROUNDED BY WORD LINE

CROSS-REFERENCE TO RELATED APPLICATIONS

The present application is a continuation of U.S. patent application Ser. No. 17/158,756 filed on Jan. 26, 2021, which claims priority to Korean Patent Application No. 10-2020-0080872, filed on Jul. 1, 2020, which is incorporated herein by reference in its entirety.

BACKGROUND

1. Field

Various embodiments of the present invention relate to a semiconductor device and, more particularly, to a three-dimensional semiconductor memory device with an improved integration degree.

2. Description of the Related Art

Since the degree of integration of a two-dimensional (2D) memory device is mainly determined by the area occupied by a unit memory cell, it is limited by fine pattern forming techniques. Ultra-high-price equipment is required for forming fine patterns, but it also has limitations in increasing the integration degree of a two-dimensional memory device. To address this concern, three-dimensional memory devices having memory cells arranged in three dimensions are proposed.

SUMMARY

Embodiments of the present invention are directed to a three-dimensional memory device with an improved integration degree.

In accordance with an embodiment of the present invention, a memory device includes: a substrate; an active layer spaced apart from a surface of the substrate and laterally oriented in a first direction and including an opened first side, a closed second side, and a channel layer between the first side and the second side; and a word line laterally oriented in a second direction crossing the first direction while surrounding the channel layer.

In accordance with another embodiment of the present invention, a memory device includes: a plurality of cylindrical active layers including channel layers that are laterally spaced apart from a substrate in a first direction; and a word line extending in the first direction while surrounding the channel layers of the cylindrical active layers, wherein the word line includes: an upper level portion positioned at a higher level than the channel layers; a lower level portion positioned at a lower level than the channel layers; and an intermediate level connection positioned between the upper level portion and the lower level portion while being positioned at the same level as the channel layers.

In accordance with yet another embodiment of the present invention, a memory device includes: a substrate including a peripheral circuit portion; an active layer including a nano-wire channel spaced apart from the substrate and laterally oriented; a word line laterally oriented in a direction crossing the nano-wire channel while surrounding the nano-wire channel; a bit line coupled to an end of one side of the active layer and vertically oriented from the peripheral circuit portion; and a lateral capacitor coupled to another end of the active layer and spaced apart from the substrate.

These and other features and advantages of the present invention will become better understood by the person with ordinary skill in the art of the invention from the following detailed description and drawings.

DETAILED DESCRIPTION

Figure 1:
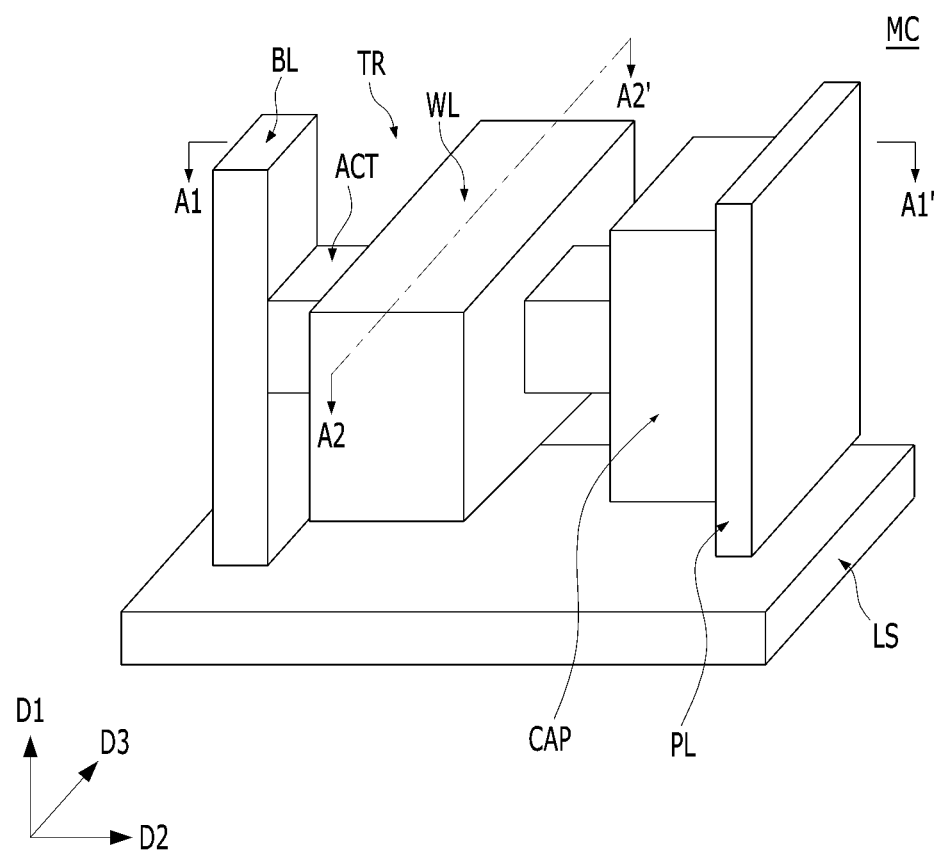
FIG. 1 is a perspective view illustrating a structure of a memory cell in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The memory devices in accordance with the embodiments of the present invention may include a lateral active layer, a gate all around word line, a vertical bit line, and a lateral capacitor.

According to the embodiments of the present invention, a word line of a transistor may have a gate all-around (GAA) structure, which is advantageous for improving the controllability of the transistor and improves a cell current. Also, the gate all-around structure may reduce the word line resistance per memory cell and completely shield the interference when a neighboring memory cell operates.

Figure 2:
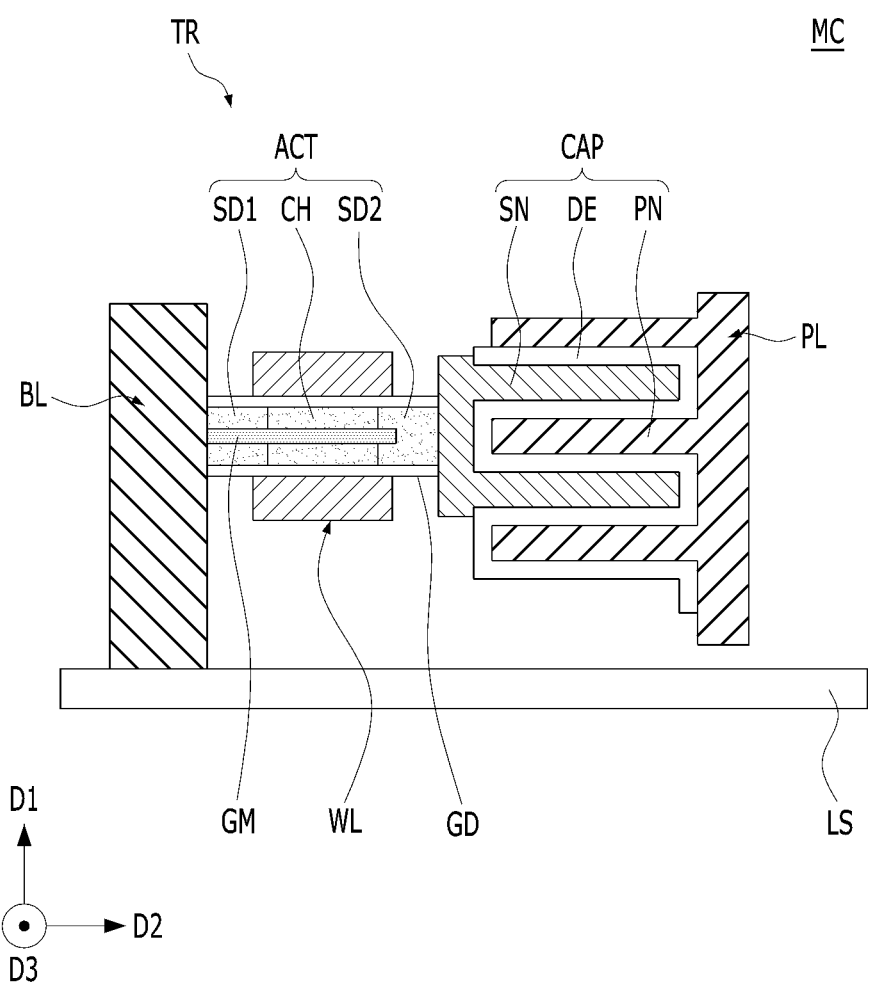
FIG. 2 is a cross-sectional view taken along a line A1-A1' shown in FIG. 1.

FIG. 1 is a perspective view illustrating a structure of a memory cell in accordance with an embodiment of the present invention. FIG. 2 is a cross-sectional view taken along a line A1-A1' shown in FIG. 1.

Referring to FIGS. 1 and 2, the memory device may include a memory cell MC. The memory cell MC may be positioned over a substrate LS. The memory cell MC may be vertically oriented along a first direction D1 from the substrate LS. The memory cell MC may include a memory cell of a Dynamic Random Access Memory (DRAM). The memory cell MC may have a three-dimensional structure.

The memory cell MC may include a bit line BL, a transistor TR, a capacitor CAP, and a plate line PL. The bit line BL may be vertically oriented along the first direction D1. The transistor TR and the capacitor CAP may be laterally arranged in the second direction D2 from the bit line BL. The second direction D2 may intersect the first direction D1, and a third direction D3 may intersect the first direction D1 and the second direction D2. The second direction D2 may be perpendicular to the first direction D1 which is vertically oriented, and a third direction D3 may be perpendicular to the plane formed by the first direction D1 and the second direction D2. The memory cell MC may include a memory cell of a three-dimensional (3D) DRAM having a 1T-1C (1 transistor-1 capacitor) structure.

The transistor TR may include an active layer ACT and a word line WL. The active layer ACT may be laterally oriented in the second direction D2 between the bit line BL and the capacitor CAP. The active layer ACT may include a channel layer CH, a first source/drain region SD1, and a second source/drain region SD2. The first source/drain region SD1 of the active layer ACT may be coupled to the bit line BL, and the second source/drain region SD2 of the active layer ACT may be coupled to the capacitor CAP. The transistor TR may include a gate all-around transistor, for example, a Gate All Around-Field Effect Transistor (GAA FET).

The word line WL may be elongated along the third direction D3. The plate line PL may be elongated along the third direction D3 while being vertically oriented in the first direction D1. The plate line PL may be coupled to the capacitor CAP.

The capacitor CAP may include a storage node SN, a dielectric layer DE, and a plate node PN. The storage node SN of the capacitor CAP may be coupled to the second source/drain region SD2 of the active layer ACT, and the plate node PN of the capacitor CAP may be coupled to the plate line PL. The plate node PN and the plate line PL may be integrated.

The capacitor CAP may include a Metal-Insulator-Metal (MIM) capacitor. The storage node SN and the plate node PN may include a metal-based material. The dielectric layer DE may include silicon oxide, silicon nitride, a high-k material, or a combination thereof. The high-k material may have a higher dielectric constant than silicon oxide. Silicon oxide $SiO_2$ may have a dielectric constant of approximately 3.9, and the dielectric layer DE may include a high-k material having a dielectric constant of approximately 4 or more. The high-k material may include a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer DE may be a composite layer including two or more layers of the high-k materials mentioned above.

The dielectric layer DE may be formed of zirconium-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer ($ZrO_2$-based layer). According to another embodiment of the present invention, the dielectric layer DE may be formed of hafnium-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and HAH stack may be referred to as a hafnium oxide-based layer ($HfO_2$-based layer). In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-band gap material having a larger band gap than the high-k material. The dielectric layer DE may include silicon oxide ($SiO_2$) as a high-band gap material other than aluminum oxide ($Al_2O_3$). The dielectric layer DE may include a high band gap material to suppress leakage current. The high band gap material may be extremely thin. The high band gap material may be thinner than a high-k material. According to another embodiment of the present invention, the dielectric layer DE may include a laminated structure in which a high-k material and a high-band gap material are alternately stacked. For example, ZAZA($ZrO_2/Al_2O_3/ZrO_2/Al_2O_3$), ZAZAZ($ZrO_2/Al_2O_3/ZrO_2/Al_2O_3/ZrO_2$), HAHA($HfO_2/Al_2O_3/HfO_2/Al_2O_3$) or HAHAH($HfO_2/Al_2O_3/HfO_2/Al_2O_3/HfO_2$). In the laminated structure as described above, aluminum oxide ($Al_2O_3$) may be extremely thin.

According to another embodiment of the present invention, the dielectric layer DE may include a stack structure including zirconium oxide, hafnium oxide, and aluminum oxide, a laminate structure, or a combination thereof.

According to another embodiment of the present invention, an interface control layer for improving leakage current may be further formed between a storage node SN and the dielectric layer DE. The interface control layer may include titanium oxide ($TiO_2$). The interface control layer may also be formed between a plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide (RuO$_2$), iridium oxide (IrO$_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN, and titanium nitride (TiN) may substantially serve as a plate node of the capacitor CAP, while the tungsten nitride may be a low resistance material.

The storage node SN may have a three-dimensional structure, which is a lateral three-dimensional structure parallel to the second direction D2. As an example of the three-dimensional structure, the storage node SN may have a cylinder shape, a pillar shape, or a pylinder shape in which a pillar shape and a cylinder shape are merged.

The substrate LS may be a material which is appropriate for semiconductor processing. The substrate LS may include at least one or more among a conductive material, a dielectric material, and a semiconductor material. Various materials may be formed over the substrate LS. The substrate LS may include a semiconductor substrate. The substrate LS may be formed of a material containing silicon. The substrate LS may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate LS may include another semiconductor material, such as germanium. The substrate LS may include a group-III/V semiconductor substrate, for example, a compound semiconductor substrate, such as gallium arsenide (GaAs). The substrate LS may include a Silicon-On-Insulator (SOI) substrate.

According to another embodiment of the present invention, the substrate LS may include a peripheral circuit portion (not shown). The peripheral circuit portion may include a plurality of control circuits for controlling a memory cell MC. At least one control circuit of the peripheral circuit portion may include an N-channel transistor, a P-channel transistor, a CMOS circuit, or a combination thereof. At least one control circuit of the peripheral circuit portion PC may include an address decoder circuit, a read circuit, and a write circuit. At least one control circuit of the peripheral circuit unit PC may include a planar channel transistor, a recess channel transistor, a buried gate transistor, a fin channel transistor (FinFET) and the like.

For example, the peripheral circuit portion may include a sense amplifier SA, and the sense amplifier SA may be coupled to a bit line BL of the memory cell MC. The peripheral circuit portion may further include a word line driver, and the word line driver may be coupled to a word line WL of the memory cell MC.

Although not shown, the plate line PL may be coupled to another peripheral circuit portion or the substrate LS.

The bottom portion of the bit line BL may be coupled to the substrate LS. The bit line BL may have a pillar-shape. The bit line BL may be referred to as a vertically oriented bit line or a pillar-type bit line. The bit line BL may include a low-resistance conductive material. The bit line BL may include polysilicon, a metal, a metal nitride, a metal silicide, or a combination thereof. The bit line BL may include a silicon-based material, a metal-based material, or a combination thereof. The bit line BL may include polysilicon, titanium nitride, tungsten, or a combination thereof. For example, the bit line BL may include polysilicon doped with an N-type impurity or titanium nitride (TiN). The bit line BL may include a stack of titanium nitride and tungsten (TiN/W). The bit line BL may further include an ohmic contact layer such as a metal silicide. The bit line BL may include pillar-type tungsten and titanium nitride surrounding the outer wall of the pillar-type tungsten.

The active layer ACT may include a semiconductor material. The active layer ACT may include a silicon layer, for example, doped polysilicon, undoped polysilicon, or amorphous silicon. The active layer ACT may include polysilicon nano-wire. According to another embodiment of the present invention, the active layer ACT may include an oxide semiconductor material. The active layer ACT may include a compound of a transition metal and a chalcogen. The active layer ACT may include InGaZnO$_x$ (IGZO), InSnZnO$_x$, ZnSnO$_x$, MoS$_2$, WS$_2$, or MoSe$_2$. The first source/drain region SD1 and the second source/drain region SD2 may be positioned at both ends of the active layer ACT, individually.

The word line WL may surround a portion of the active layer ACT. The word line WL may include a gate all-around (GAA) structure. The portion surrounded by the word line WL may be a channel layer CH of the active layer ACT. The word line WL may include a low-resistance conductive material. The word line WL may include a low-resistance metal material. The word line WL may include polysilicon, a metal, a metal nitride, a metal silicide, or a combination thereof. The word line WL may include a silicon-based material, a metal-based material, or a combination thereof. The word line WL may include tungsten (W), titanium nitride (TiN), tantalum nitride (TaN), tantalum carbon nitride (TaCN), molybdenum (Mo), molybdenum nitride (MoN), ruthenium (Ru), cobalt (Co), or a combination thereof. The word line WL may include polysilicon, titanium nitride, tungsten, or a combination thereof. For example, the word line WL may include a stack of titanium nitride and tungsten (TiN/W).

A gate dielectric layer GD may be positioned between the word line WL and the active layer ACT. The gate dielectric layer GD may cover the outer surfaces of the active layer ACT. The gate dielectric layer GD may surround the active layer ACT. The gate dielectric layer GD may include silicon oxide, silicon nitride, a high-k material, a ferroelectric material, an anti-ferroelectric material, or a combination thereof.

Referring back to FIG. 2, the gap-fill material GM may be positioned in the active layer ACT. The gap-fill material GM may be embedded in the active layer ACT. The gap-fill material GM may include a dielectric material. The gap-fill material GM may include silicon oxide or silicon nitride. One side of the gap-fill material GM may be coupled to the bit line BL. The gap-fill material GM may extending along the second direction D2. The gap-fill material GM may not be coupled to a storage node SN of the capacitor CAP. The gap-fill material GM may pass through the first source/drain region SD1, the channel region and enter the second source/drain region SD2 but may not penetrate the second source/drain region SD2. The first source/drain region SD1 may surround an end of one side of the gap-fill material GM. The channel layer CH may surround the center of the gap-fill material GM. The second source/drain region SD2 may surround an end of the other end of the gap-fill material GM. The gap-fill material GM may be positioned centrally within the first source/drain region SD1, and the channel region CH.

Figure 3A:
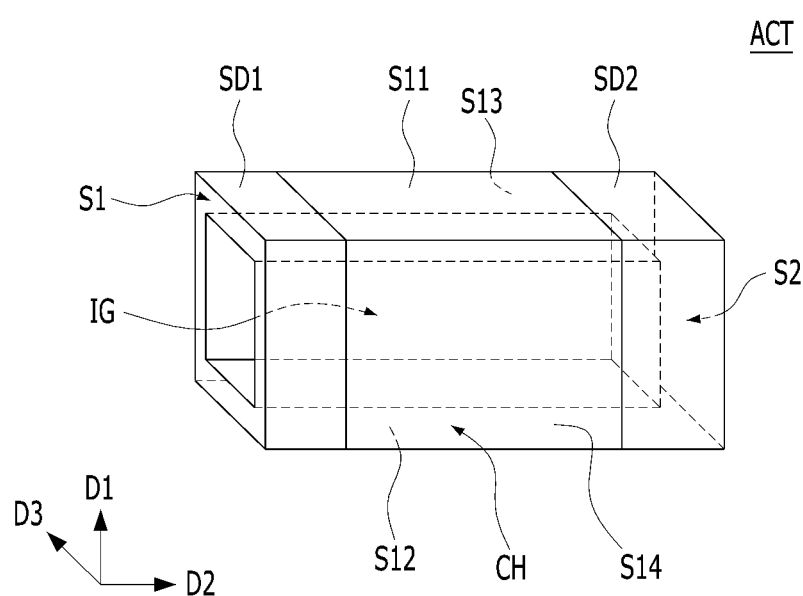
FIGS. 3A to 3C are perspective views illustrating a structure of an active layer ACT.
Figure 3B:
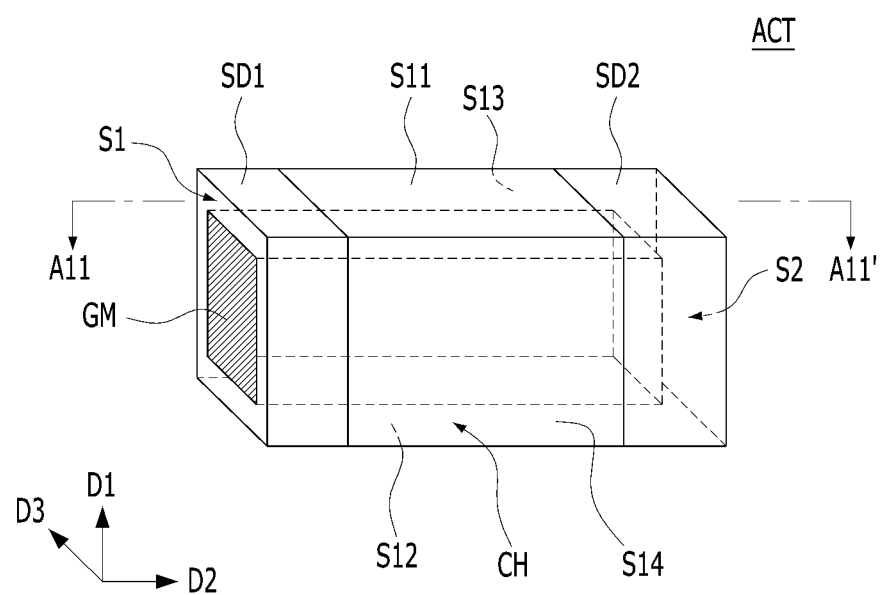
Figure 3C:
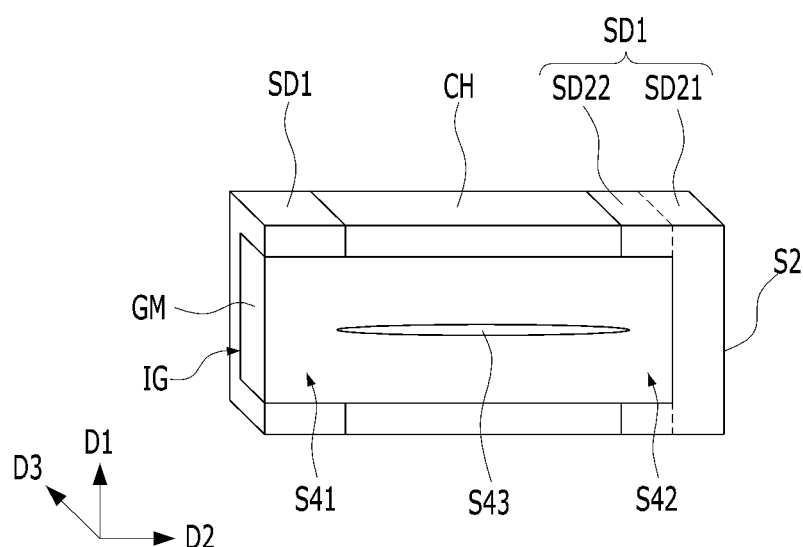

FIGS. 3A to 3C are perspective views illustrating a structure of an active layer ACT. FIG. 3A is a detailed view of the active layer ACT, and FIG. 3B is a detailed view of the active layer ACT including an embedded gap-fill material. FIG. 3C is a cross-sectional view taken along a line A11-A11' of FIG. 3B.

Referring to FIGS. 3A to 3C, the active layer ACT may have a three-dimensional cylinder shape. The active layer ACT may extend along the second direction D2. The active layer ACT may include a first side S1 and a second side S2 which is opposite to the first side S1. The first side S1 and the second side S2 may face each other in the second direction D2. The active layer ACT may include a channel layer CH between the first side S1 and the second side S2.

According to an embodiment of the present invention, the channel layer CH may include four outer surfaces S11, S12, S13, and S14. The first outer surface S11 and the second outer surface S12 may face each other in the first direction D1 and may be parallel in the second direction D2. The third outer surface S13 and the fourth outer surface S14 may face each other in the third direction D3 and may be parallel in the second direction D2. The first to fourth outer surfaces S11 to S14 may extend in the second direction D2.

The first side S1 may be a side of an opened shape, and the second side S2 may be a side of a closed shape. As for the first side S1, the cross-section in the first direction D1 may have a rectangular ring shape, and as for the second side S2, the cross section in the first direction D1 may have a rectangular shape. According to another embodiment of the present invention, the cross section of the first side S1 in the first direction D1 may have a circular ring shape, an elliptical ring shape, or a polygonal ring shape. The cross section of the second side S2 in the first direction D1 may have a circular shape, an elliptical shape, or a polygonal shape.

The active layer ACT may further include an inner empty space, that is, an inner gap IG. The inner gap IG may extend in the second direction D2. The inner gap IG may be defined inside the active layer ACT by the first side S1, the second side S2, and the channel layer CH. The inner gap IG may be opened by the first side S1 and may be closed by the second side S2. The active layer ACT including the inner gap IG, the first side S1, and the second side S2 may have a cylindrical shape or a macaroni shape. The active layer ACT may have a macaroni-shaped nano-wire structure. The active layer ACT may include a macaroni-shaped polysilicon nano-wire, an oxide semiconductor nano-wire, or a compound nano-wire of a transition metal and chalcogen. The channel layer CH may include a nano-wire channel, and for example, the channel layer CH may include a macaroni-shaped polysilicon nano-wire, an oxide semiconductor nano-wire, or a compound nano-wire of a transition metal and chalcogen. According to the embodiment of the present invention, the channel layer CH may include a macaroni-shaped polysilicon nano-wire.

A first source/drain region SD1 and a second source/drain region SD2 may be positioned on both sides of the channel layer CH, individually. The first source/drain region SD1 and the second source/drain region SD2 may be formed by a doping process of impurities. For example, the first source/drain region SD1 may be formed by doping and diffusing an impurity on the first side S1 of the active layer ACT. The second source/drain region SD2 may be formed by doping and diffusing an impurity on the second side S2 of the active layer ACT. The dimension ("widths") of the first source/drain region SD1 and the second source/drain region SD2 in the second direction D2 may be smaller than the width of the channel layer CH in the second direction D2. The first source/drain region SD1 may be coupled to the bit line BL, and the second source/drain region SD2 may be coupled to the storage node SN of the capacitor CAP. When the bit line BL includes pillar-type tungsten and titanium nitride surrounding the outer wall of the pillar-type tungsten, the first source/drain region SD1 may directly contact the titanium nitride. A portion of the bit line BL may close the opened first side S1 of the active layer ACT.

Referring to FIG. 3B, the inner gap IG may be filled with a gap-fill material GM. The gap-fill material GM may have a lateral pillar shape extending laterally in the second direction D2. The active layer ACT filled with the gap-fill material GM may be referred to as an active layer ACT including the embedded gap-fill material GM. The gap-fill material GM may directly contact the inner surfaces of the channel layer CH. The gap-fill material GM may directly contact the inner surfaces of the first source/drain region SD1. The gap-fill material GM may directly contact the inner surfaces of the second source/drain region SD2. The first source/drain region SD1 may surround outer surfaces of the gap-fill material GM. Portions of the second source/drain region SD2 may surround outer surfaces of the gap-fill material GM, and the edge portion of the second source/drain region SD2 may cover the edge portion of the gap-fill material GM.

The active layer ACT may include a semiconductor material such as polysilicon. The active layer ACT may include doped polysilicon, undoped polysilicon, or amorphous silicon. The first source/drain region SD1 and the second source/drain region SD2 may be doped with an N-type impurity or a P-type impurity. The first source/drain region SD1 and the second source/drain region SD2 may be doped with impurities of the same conductivity type. The first source/drain region SD1 and the second source/drain region SD2 may include at least one among arsenic (As), phosphorus (P), boron (B), indium (In), and combinations thereof. The channel layer CH may function as a channel of a transistor TR. According to another embodiment of the present invention, the active layer ACT may include $InGaZnO_x$, $InSnZnO_x$, $ZnSnO_x$, $MoS_2$, $WS_2$, or $MoSe_2$.

Referring to FIGS. 3B and 3C, the first source/drain region SD1 may provide a first side S1 and may surround an end S41 of one side of the gap-fill material GM. The second source/drain region SD2 may include a vertical sidewall SD21 providing the second side S2 and a protrusion SD22 extending from the vertical sidewall SD21. The protrusion SD22 may surround an end S42 of the other side of the gap-fill material GM. The channel layer CH may surround the gap-fill material GM. According to some embodiments of the present invention, the gap-fill material GM may include an embedded air gap S43.

Figure 4:
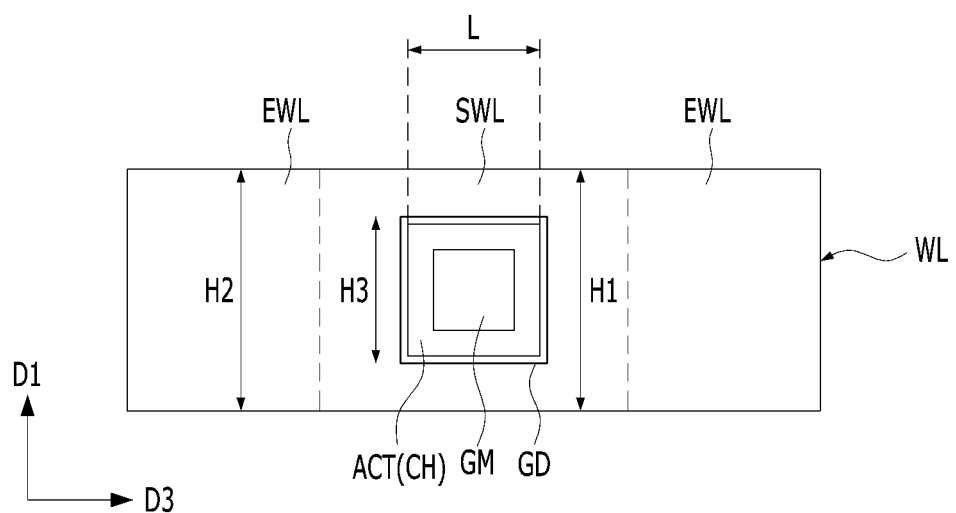
FIG. 4 is a cross-sectional view taken along a line A2-A2' shown in FIG. 1.

FIG. 4 is a cross-sectional view taken along a line A2-A2' shown in FIG. 1.

Referring to FIG. 4, the word line WL may extend along the third direction D3. The word line WL may include a surrounding portion SWL and extended portions EWL respectively extending from both sides of the surrounding portion SWL in the third direction D3. The surrounding portion SWL of the word line WL may surround the channel layer CH of the active layer ACT. A gate dielectric layer GD may be positioned between the surrounding portion SWL of the word line WL and the channel layer CH of the active layer ACT. The gate dielectric layer GD may surround the channel layer CH of the active layer ACT. The gap-fill material GM may be embedded in the inside of the active layer ACT. The surrounding portion SWL of the word line WL may surround the channel layer CH of the active layer ACT with the gate dielectric layer GD interposed therebetween. The extended portions EWL of the word line WL may not surround the channel layer CH of the active layer ACT.

The surrounding portion SWL and the extended portions EWL of the word line WL may have the same height (H1=H2) in the first direction D1. The height of the surrounding portion SWL and the extended portions EWL of the word line WL may be greater than the height H3 of the channel layer CH.

The surrounding portion SWL and the extended portions EWL of the word line WL may have the same length in the third direction D3.

Referring to FIGS. 1 and 4, the surrounding portion SWL and the extended portions EWL of the word line WL may have the same width in the second direction D2.

The surrounding portion SWL and the extended portions EWL of the word line WL may be formed of the same material.

Figure 5:
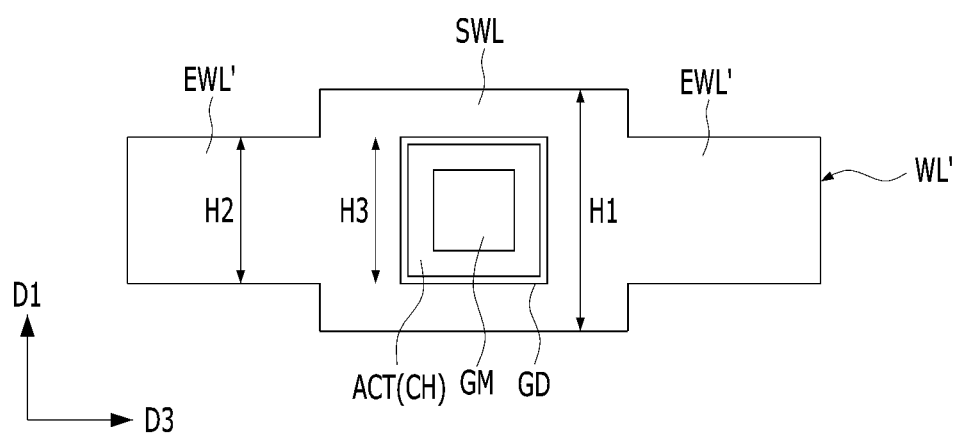
FIG. 5 illustrates a modified example of a word line.

FIG. 5 illustrates a modified example of a word line WL' compared to the word line WL of FIG. 4. In FIG. 5, the same reference numerals also appearing in FIG. 4 may denote the same constituent elements. Hereinafter, detailed descriptions of the constituent elements of FIG. 5 also appearing in FIG. 4 will be omitted.

Referring to FIG. 5, the word line WL' may be elongated along the third direction D3. The word line WL' may include a surrounding portion SWL and extended portions EWL' respectively extending from both sides of the surrounding portion SWL in the third direction D3.

The surrounding portion SWL of the word line WL' may surround the channel layer CH of the active layer ACT. A gate dielectric layer GD may be positioned between the surrounding portion SWL of the word line WL' and the channel layer CH of the active layer ACT. The gate dielectric layer GD may surround the channel layer CH of the active layer ACT. A gap-fill material GM may be embedded in the active layer ACT. The surrounding portion SWL of the word line WL' may surround the channel layer CH of the active layer ACT with the gate dielectric layer GD interposed therebetween. The extended portions EWL' of the word line WL' may not surround the channel layer CH of the active layer ACT.

The surrounding portion SWL and the extended portions EWL' of the word line WL' may have different heights (H1>H2) in the first direction D1. The height H1 of the surrounding portion SWL may be greater than the height H2 of the extended portions EWL'. The height H2 of the extended portions EWL of the word line WL may be the same as the height H3 of the channel layer CH. According to another embodiment of the present invention, the height H2 of the extended portions EWL of the word line WL may be greater or less than the height H3 of the channel layer CH.

The upper surface of the surrounding portion SWL may be positioned at a higher level than the upper surface of the extended portions EWL'. The lower surface of the surrounding portion SWL may be positioned at a lower level than the lower surface of the extended portions EWL'.

The surrounding portion SWL of the word line WL may have the same length in the third direction D3 with each of the extended portions EWL' of the word line WL.

Figure 6A:
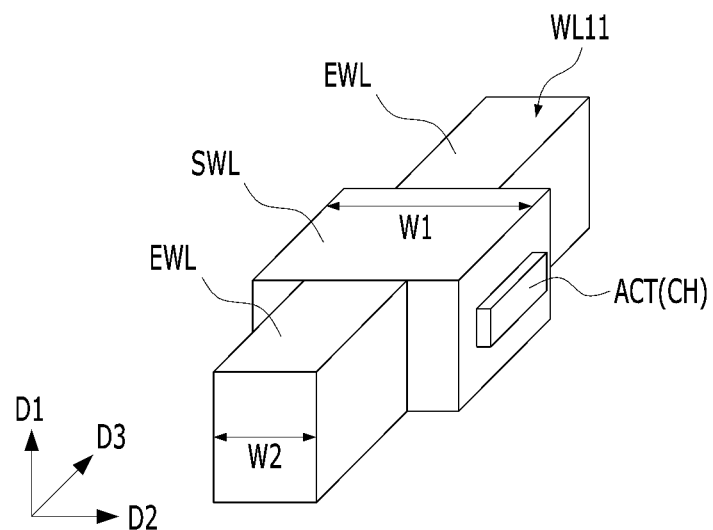
FIGS. 6A and 6B are perspective views illustrating other modified examples of the word line.
Figure 6B:
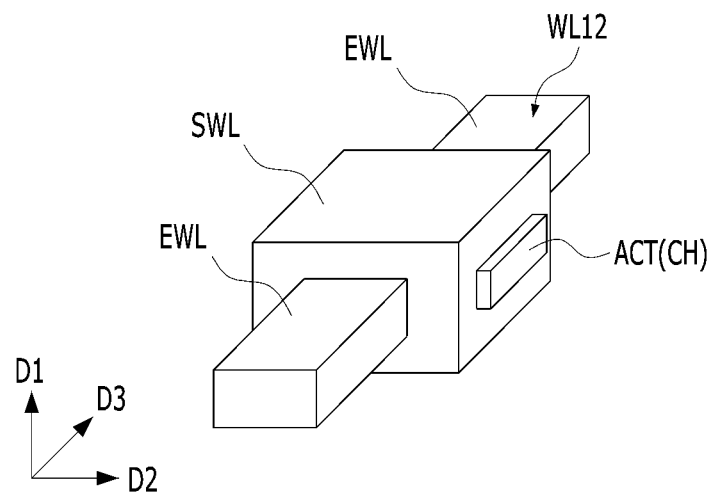

FIGS. 6A and 6B are perspective views illustrating other modified examples of the word line. Hereinafter, the word lines WL11 and WL12 may be similar to the word lines WL and WL' shown in FIGS. 4 and 5. In FIGS. 6A and 6B, the reference numerals also appearing in FIGS. 4 and 5 may denote the same constituent elements. Hereinafter, detailed description of the constituent elements of FIGS. 6A and 6B also appearing in FIGS. 4 and 5 may be omitted.

Referring to FIG. 6A, the word line WL11 may be elongated along the third direction D3. The word line WL11 may include a surrounding portion SWL and extended portions EWL respectively extending from both sides of the surrounding portion SWL in the third direction D3. The surrounding portion SWL of the word line WL11 may surround the channel layer CH of the active layer ACT. The extended portions EWL of the word line WL11 may not surround the channel layer CH of the active layer ACT.

The surrounding portion SWL and the extended portions EWL of the word line WL11 may have different widths (W1>W2) in the second direction D2. The width W1 of the surrounding portion SWL may be greater than the width W2 of the extended portions EWL.

The surrounding portion SWL and the extended portions EWL of the word line WL11 may have the same length in the third direction D3.

Referring to FIG. 6B, the word line WL12 may be elongated along the third direction D3. The word line WL12 may include a surrounding portion SWL and extended portions EWL respectively extending from both sides of the surrounding portion SWL in the third direction. The surrounding portion SWL of the word line WL12 may surround the channel layer CH of the active layer ACT. The extended portions EWL of the word line WL12 may not surround the channel layer CH of the active layer ACT.

The surrounding portion SWL and the extended portions EWL of the word line WL12 may have different widths in the second direction D2. The width of the surrounding portion SWL may be greater than the width of the extended portions. Also, the surrounding portion SWL and the extended portions EWL of the word line WL12 may have different heights in the first direction D1. The height of the surrounding portion SWL may be greater than the height of the extended portions EWL. The extended portions EWL of the word line WL12 may be the same as the height of the channel layer CH. The upper surface of the surrounding portion SWL may be positioned at a higher level than the upper surface of the extended portions EWL. The lower surface of the surrounding portion SWL may be positioned at a lower level than the lower surface of the extended portions EWL.

The surrounding portion SWL and the extended portions EWL of the word line WL12 may have the same length in the third direction D3.

FIGS. 7A to 7D are perspective views illustrating other modified examples of the word line. Hereinafter, the word lines WL21, WL22, WL23, and WL24 may be similar to the word lines WL and WL' shown in FIGS. 4, 5, 6A, and 6B. In FIGS. 7A to 7D, the same reference numerals also appearing in FIGS. 4 to 6B may denote the same constituent elements. Hereinafter, detailed description of the constituent elements of FIGS. 7A to 7D also appearing in FIGS. 4 to 6B may be omitted.

Figure 7A:
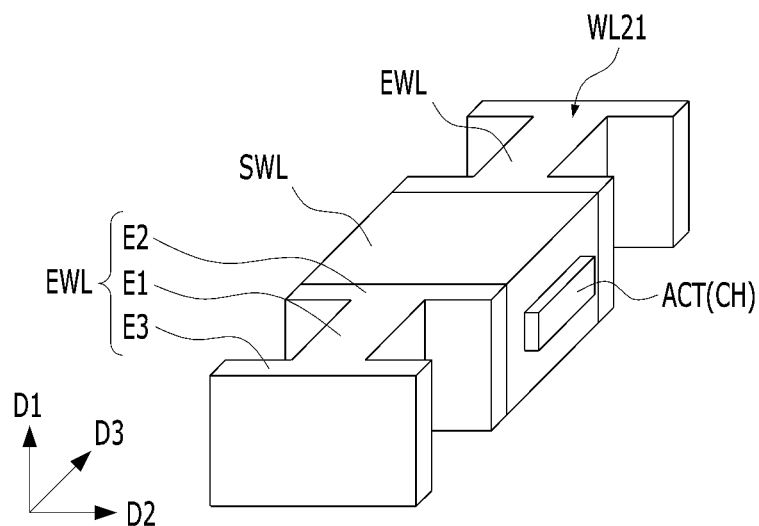
FIGS. 7A to 7D are perspective views illustrating other modified examples of the word line.

Referring to FIG. 7A, the word line WL21 may be elongated along the third direction D3. The word line WL21 may include a surrounding portion SWL and extended portions EWL respectively extending from both sides of the surrounding portion SWL in the third direction D3. The surrounding portion SWL of the word line WL21 may surround the channel layer CH of the active layer ACT. The extended portions EWL of the word line WL21 may not surround the channel layer CH of the active layer ACT.

The extended portions EWL of the word line WL21 may include a first portion E1, a second portion E2 and a third portion E3. The second and third portions E2 and E3 are respectively positioned on both sides of the first portion E1. The second portion E2 may be coupled to the surrounding portion SWL. The third portion E3, the first portion E1, and the second portion E2 may be laterally arranged in the third direction D3. The first portion E1, the second portion E2, and the third portion E3 may be integrated to have a dog bone shape. The first portion E1 of the extended portions EWL may have a width that is smaller than the widths of the second portion E2 and the third portion E3 in the second direction D2. The length of the first portion E1 may be longer than each of the lengths of the second and third portions E2 and E3. The lengths of the second and third portions E2 and E3 may be the same.

The surrounding portion SWL of the word line WL21, and the second portion E2 and the third portion E3 of the extended portions EWL may have the same width in the second direction D2.

The surrounding portion SWL and the extended portions EWL of the word line WL21 may have the same length in the third direction D3.

Figure 7B:
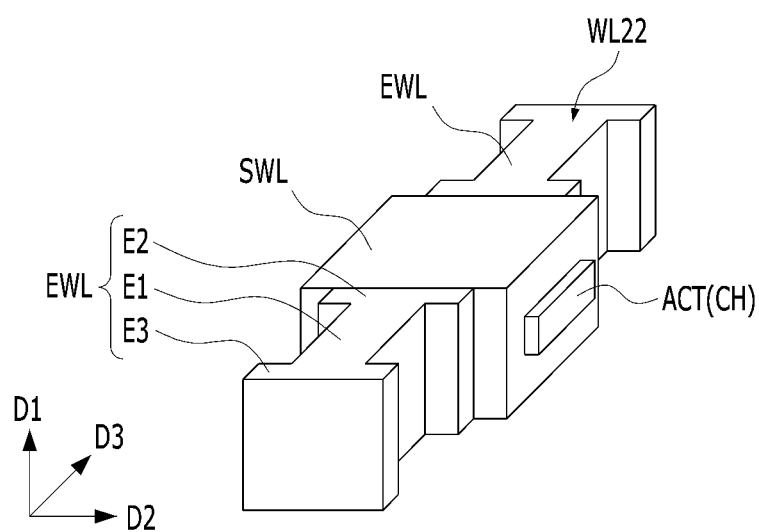

Referring to FIG. 7B, the word line WL22 may be elongated along the third direction D3. The word line WL22 may include a surrounding portion SWL and extended portions EWL extending from both sides of the surrounding portion SWL, respectively. The surrounding portion SWL of the word line WL22 may surround the channel layer CH of the active layer ACT. The extended portions EWL of the word line WL22 may not surround the channel layer CH of the active layer ACT.

The extended portions EWL of the word line WL22 may include a first portion E1, a second portion E2 and a third portion E3. The second portion E2 and the third portion E3 are respectively positioned on both sides of the first portion E1. The second portion E2 may be coupled to the surrounding portion SWL. The third portion E3, the first portion E1, and the second portion E2 may be laterally arranged in the third direction D3. The first portion E1, the second portion E2, and the third portion E3 may be integrated to have a dog bone shape. The first portion E1 of the extended portions EWL may have a width that is smaller than the widths of the second portion E2 and the third portion E3 in the second direction D2.

The second portion E2 and the third portion E3 of the extended portions EWL may have the same width in the second direction D2. The second portion E2 and the third portion E3 of the extended portions EWL may have a width which is smaller than the width of the surrounding portion SWL of the word line WL22 in the second direction D2.

The surrounding portion SWL and the extended portions EWL of the word line WL22 may have the same length in the third direction D3. The length of the first portion E1 may be longer than each of the lengths of the second and third portions E2 and E3. The lengths of the second and third portions E2 and E3 may be the same.

Figure 7C:
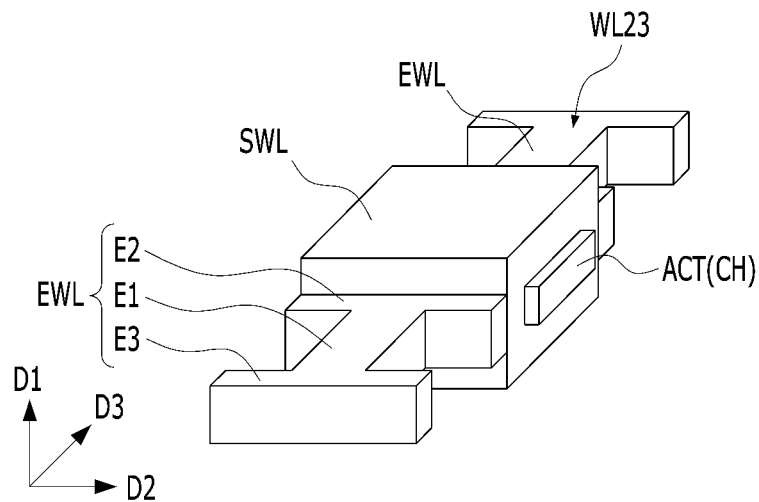

Referring to FIG. 7C, the word line WL23 may be elongated along the third direction D3. The word line WL23 may include a surrounding portion SWL and extended portions EWL respectively extending from both sides of the surrounding portion SWL in the third direction D3. The surrounding portion SWL of the word line WL23 may surround the channel layer CH of the active layer ACT. The extended portions EWL of the word line WL23 may not surround the channel layer CH of the active layer ACT.

The extended portions EWL of the word line WL23 may include a first portion E1, a second portion E2 and a third portion E3. The second portion E2 and the third portion E3 are respectively positioned on both sides of the first portion E1. The second portion E2 may be coupled to the surrounding portion SWL. The third portion E3, the first portion E1, and the second portion E2 may be laterally arranged in the third direction D3. The first portion E1, the second portion E2, and the third portion E3 may be integrated to have a dog bone shape. The first portion E1 of the extended portions EWL may have a width which is smaller than the widths of the second portion E2 and the third portion E3 in the second direction D2.

The second portion E2 and the third portion E3 of the extended portions EWL may have the same width in the second direction D2. The second portion E2 and the third portion E3 of the extended portions EWL may have the same width as the surrounding portion SWL of the word line WL23 in the second direction D2.

The surrounding portion SWL and the extended portions EWL of the word line WL23 may have the same length in the third direction D3. The extended portions EWL of the word line WL23 may have a height which is lower than that of the surrounding portion SWL in the first direction D1. The first portion E1, the second portion E2, and the third portion E3 of the extended portions EWL may have a height which is lower than that of the surrounding portion SWL in the first direction D1.

Figure 7D:
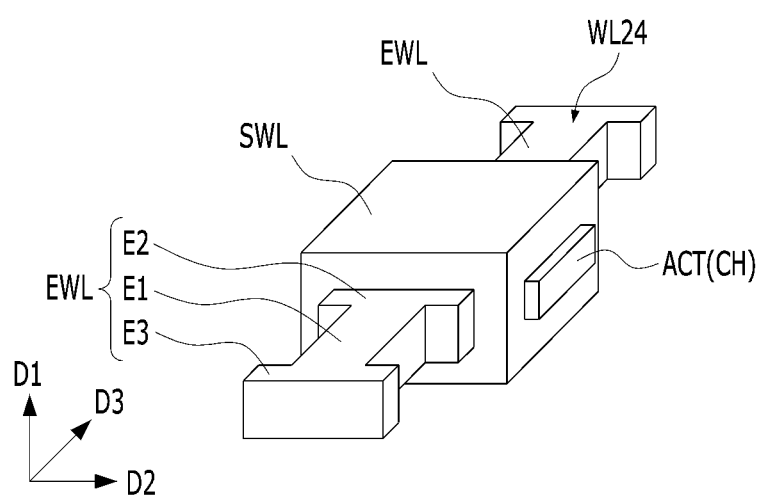

Referring to FIG. 7D, the word line WL24 may be elongated along the third direction D3. The word line WL24 may include a surrounding portion SWL and extended portions EWL respectively extending from both sides of the surrounding portion SWL in the third direction D3. The surrounding portion SWL of the word line WL24 may surround the channel layer CH of the active layer ACT. The extended portions EWL of the word line WL24 may not surround the channel layer CH of the active layer ACT.

The extended portions EWL of the word line WL24 may include a first portion E1, and a second portion E2 and a third portion E3 that are respectively positioned on both sides of the first portion E1. The second portion E2 may be coupled to the surrounding portion SWL. The third portion E3, the first portion E1, and the second portion E2 may be laterally arranged in the third direction D3. The first portion E1, the second portion E2, and the third portion E3 may be integrated to have a dog bone shape. The first portion E1 of the extended portions EWL may have a width which is less than the widths of the second portion E2 and the third portion E3 in the second direction D2.

The second portion E2 and the third portion E3 of the extended portions EWL may have the same width in the second direction D2. The second portion E2 and the third portion E3 of the extended portions EWL may have a width which is smaller than the width of the surrounding portion SWL of the word line WL24 in the second direction D2.

The surrounding portion SWL and the extended portions EWL of the word line WL23 may have the same length in the third direction D3. The extended portions EWL of the word line WL23 may have a height which is lower than that of the surrounding portion SWL in the first direction D1. The first portion E1, the second portion E2, and the third portion E3 of the extended portions EWL may have a height which is lower than that of the surrounding portion SWL in the first direction D1.

Figure 8A:
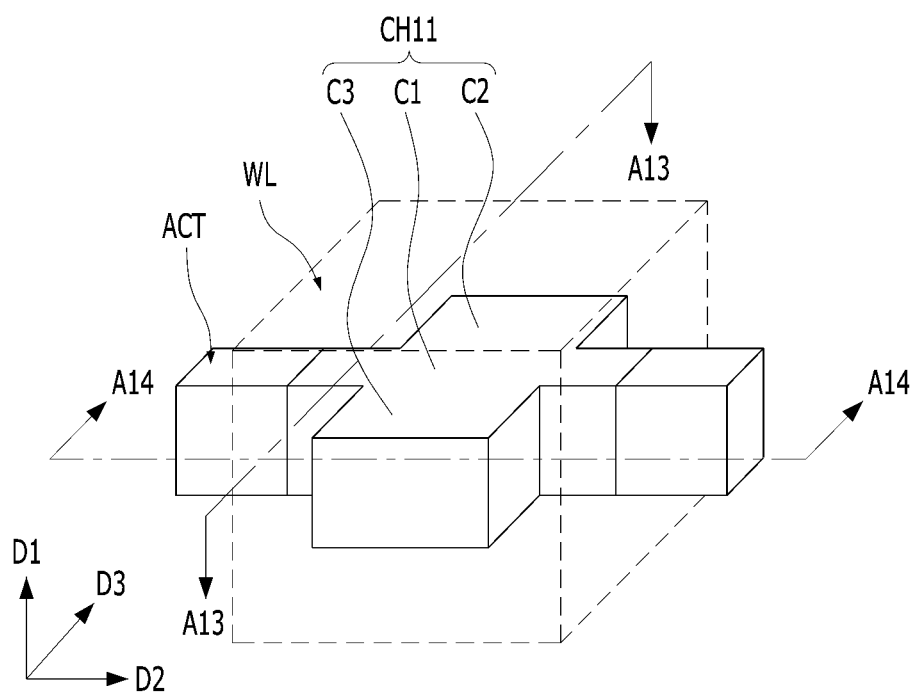
FIGS. 8A to 8C illustrate an active layer in accordance with another embodiment of the present invention.
Figure 8B:
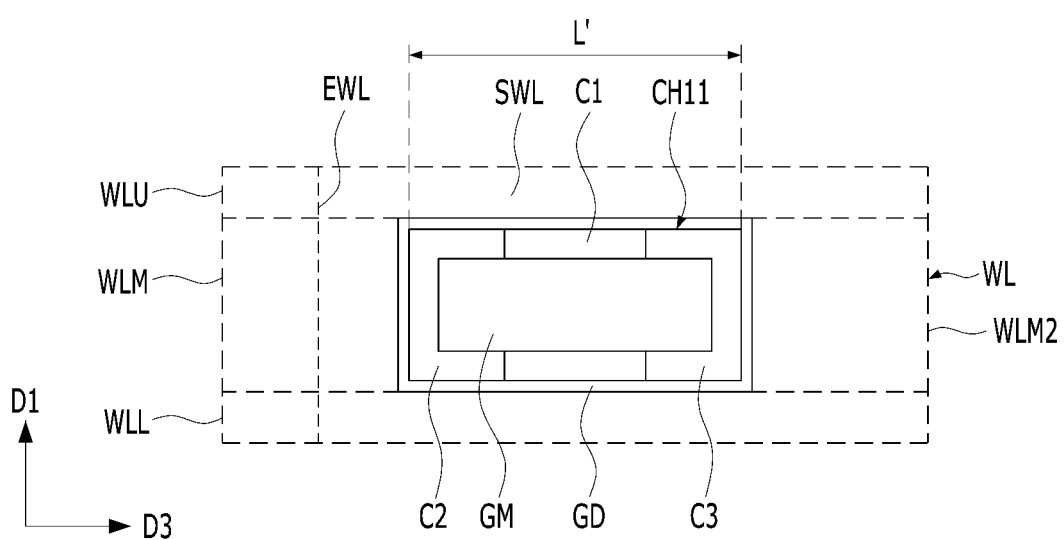
Figure 8C:
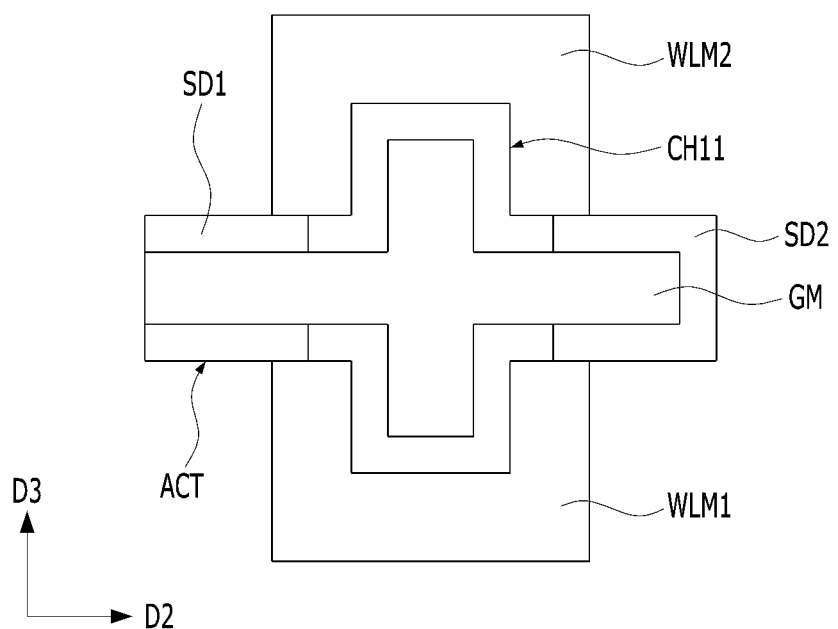

FIGS. 8A to 8C illustrate an active layer in accordance with another embodiment of the present invention. FIG. 8B is a cross-sectional view taken along a line A13-A13' of FIG. 8A. FIG. 8C is a layout according to a line A14-A14' of FIG. 8A.

Referring to FIGS. 8A to 8C, the active layer ACT may have a cross shape. The active layer ACT may include a cross-type channel layer CH11. The cross-type channel layer CH11 may include a center portion C1 and branch portions C2 and C3 on both sides of the center portion C1. The center portion C1 may refer to a portion extending in the second direction D2. The branch portions C2 and C3 may refer to portions extending from the center portion C1 in the third direction D3. The cross shape may be defined by the center portion C1 and the branch portions C2 and C3.

The word line WL may surround the cross-type channel layer CH11. The gap-fill material GM may be embedded in the active layer ACT. The gap-fill material GM may have a cross shape. The active layer ACT may further include a first source/drain region SD1 and a second source/drain region SD2 on both sides of the cross-type channel layer CH11. The length L' of the cross-type channel layer CH11 of the active layer ACT in the third direction D3 may be greater than the length L of the channel layer CH of FIG. 4.

The word line WL may be elongated along the third direction D3. The word line WL may include a surrounding portion SWL and extended portions EWL respectively extending from both sides of the surrounding portion SWL in the third direction D3. The surrounding portion SWL of the word line WL may surround the cross-type channel layer CH11 of the active layer ACT. The extended portions EWL of the word line WL24 may not surround the cross-type channel layer CH11 of the active layer ACT.

The word line WL may be divided into an upper level portion WLU, intermediate level connections WLM1 and WLM2, and a lower level portion WLL according to the height of the cross-type channel layer CH11. The upper level portion WLU may be positioned at a higher level than the cross-type channel layer CH11, and the lower level portion WLL may be positioned at a lower level than the cross-type channel layer CH11. The intermediate level connections WLM1 and WLM2 may be positioned between the upper level portion WLU and the lower level portion WLL, and they may have the same height as the cross-type channel layer CH11. The intermediate level connections WLM1 and WLM2 may be positioned on both sides of the cross-type channel layer CH11 in the third direction D3, respectively. The upper level portion WLU and the lower level portion WLL may be elongated in the third direction D3. As shown in FIG. 8C, when viewed from a top view, the intermediate level connections WLM1 and WLM2 may surround the sides of the branch portions C2 and C3 of the cross-type channel layer CH11.

Figure 9A:
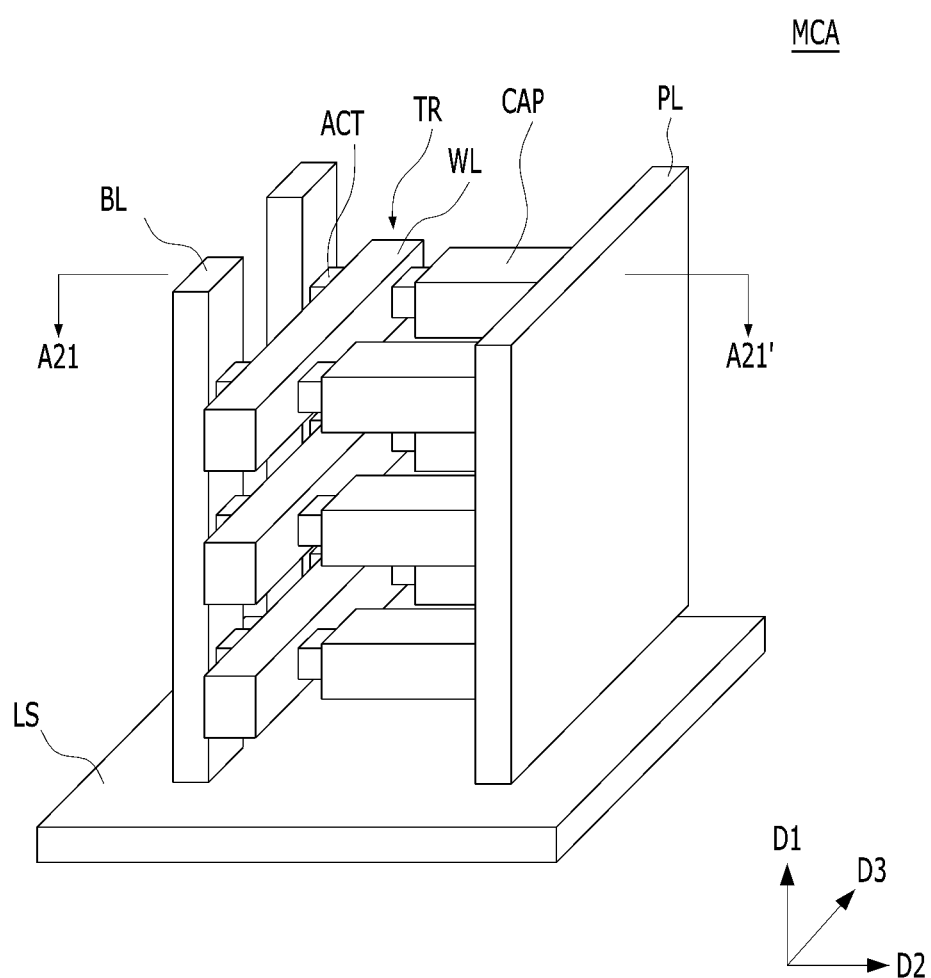
FIG. 9A is a perspective view illustrating a memory cell array.
Figure 9B:
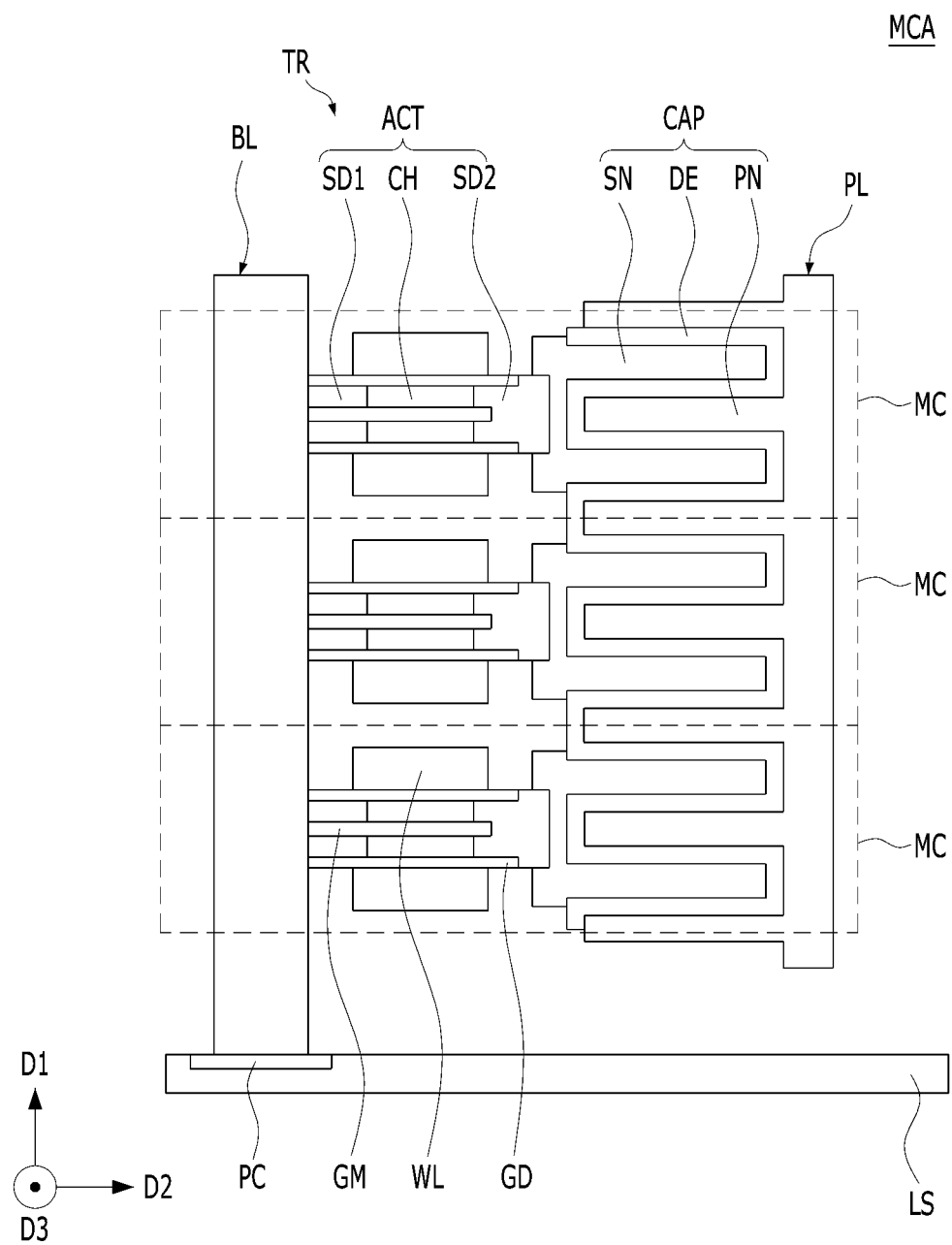
FIG. 9B is a cross-sectional view taken along a line A21-A21' shown in FIG. 9A.

FIG. 9A is a perspective view illustrating a memory cell array. FIG. 9B is a cross-sectional view taken along a line A21-A21' shown in FIG. 9A. In FIGS. 9A and 9B, the reference numerals also appearing in FIGS. 1 to 8C may denote the same constituent elements. Hereinafter, detailed description of the constituent elements of FIGS. 9A and 9B also appearing in FIGS. 1 to 8C may be omitted.

Referring to FIGS. 9A and 9B, the memory device may include a memory cell array MCA, and the memory cell array MCA may include a stack of memory cells MC. The memory cell array MCA may include a 3D array of memory cells MC. The memory cell array MCA may include a DRAM memory cell array. The memory cells MC may be vertically stacked over the substrate LS in the first direction D1. The memory cells MC which are vertically stacked may share a bit line BL and a plate line PL. The memory cells MC may be laterally arranged in the third direction D3. The laterally arranged memory cells MC may share a word line WL and a plate line PL. Each memory cell MC may be one among the memory cells described in the above-described embodiments of the present invention. As for the description on the individual memory cells MC, the above-described embodiments may be referred to.

Each memory cell MC may include a bit line BL, a transistor TR, and a capacitor CAP. A transistor TR and a capacitor CAP may be positioned in a lateral arrangement LA between the bit line BL and the plate line PL in the second direction D2. Each memory cell MC may further include a word line WL, and the word line WL may extend along its long dimension in the third direction D3. The active layer ACT and the word line WL may include the active layer ACT and the word line WL among those in accordance with the above-described embodiments of the present invention. The active layer ACT may include a channel layer CH, a first source/drain region SD1, and a second source/drain region SD2. A gap-fill material GM may be embedded in the inside of the active layer ACT. An end of one side of the gap-fill material GM may be coupled to a bit line. The word line WL may surround at least the channel layer CH. The capacitor CAP may include a storage node SN, a dielectric layer DE, and a plate node PN. The bit line BL may be coupled to the peripheral circuit portion PC, and the peripheral circuit portion PC may be provided to the substrate LS.

As for the active layer ACT and the word line WL, FIGS. 3A to 8C may be referred to.

Figure 10:
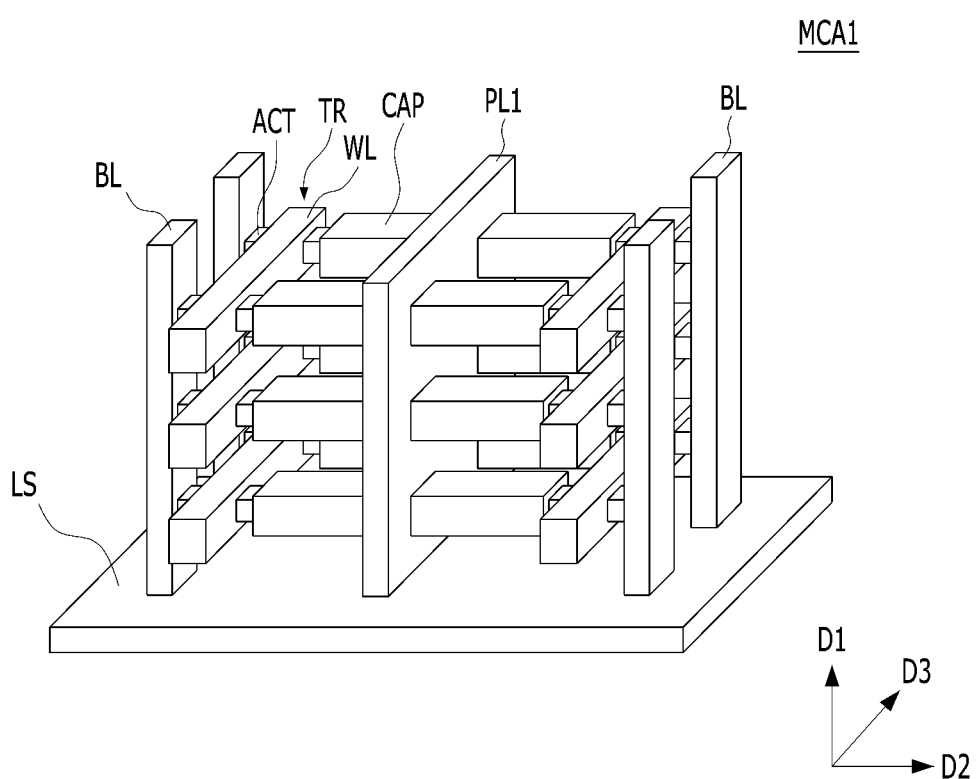
FIG. 10 is a perspective view illustrating a mirror-type memory cell array sharing a plate line.
Figure 11:
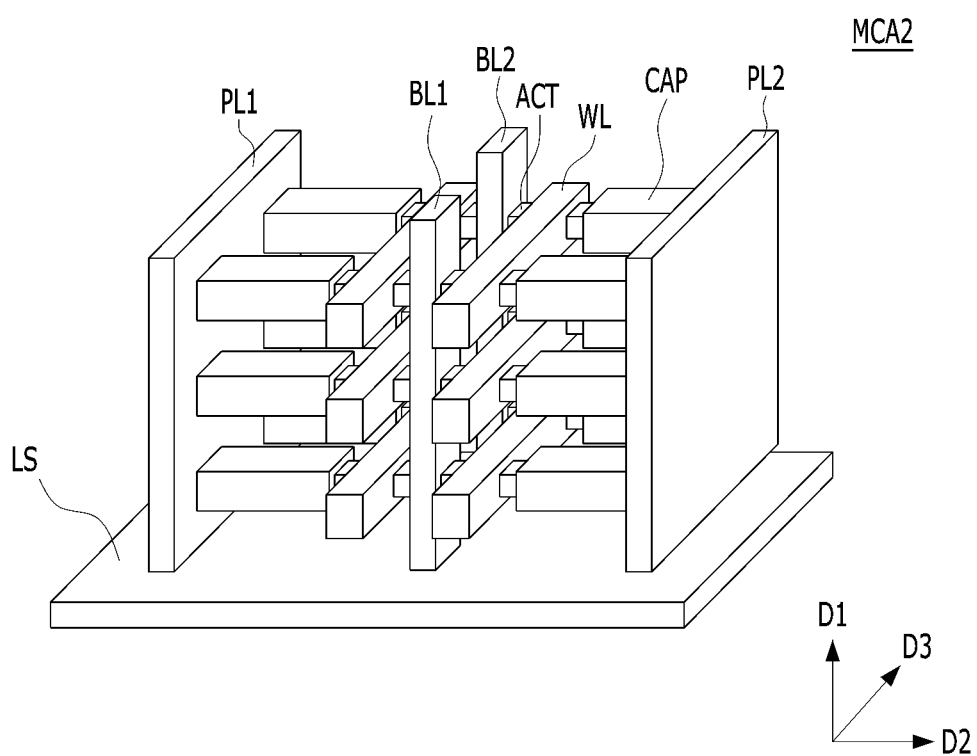
FIG. 11 is a perspective view illustrating a mirror-type memory cell array sharing a bit line.

FIG. 10 is a perspective view illustrating a mirror-type memory cell array MCA1 sharing a plate line. FIG. 11 is a perspective view illustrating a mirror-type memory cell array MCA2 sharing a bit line.

Referring to FIG. 10, memory cells of the memory cell array MCA1 may be arranged in a mirror-type structure in which the memory cells share one plate line PL1.

Referring to FIG. 11, memory cells of the memory cell array MCA2 may be arranged in a mirror-type structure in which the memory cells share one bit line BL1 and BL2. For example, the memory cells sharing the bit line BL1 may be coupled to different plate lines PL1 and PL2. The memory cells sharing the bit line BL2 may be coupled to different plate lines PL1 and PL2.

In the memory cell arrays MCA, MCA1, and MCA2 of FIGS. 9A, 9B, 10, and 11, for a description of the active layer ACT and the word line WL, FIGS. 3A to 8C may be referred to.

Figure 12:
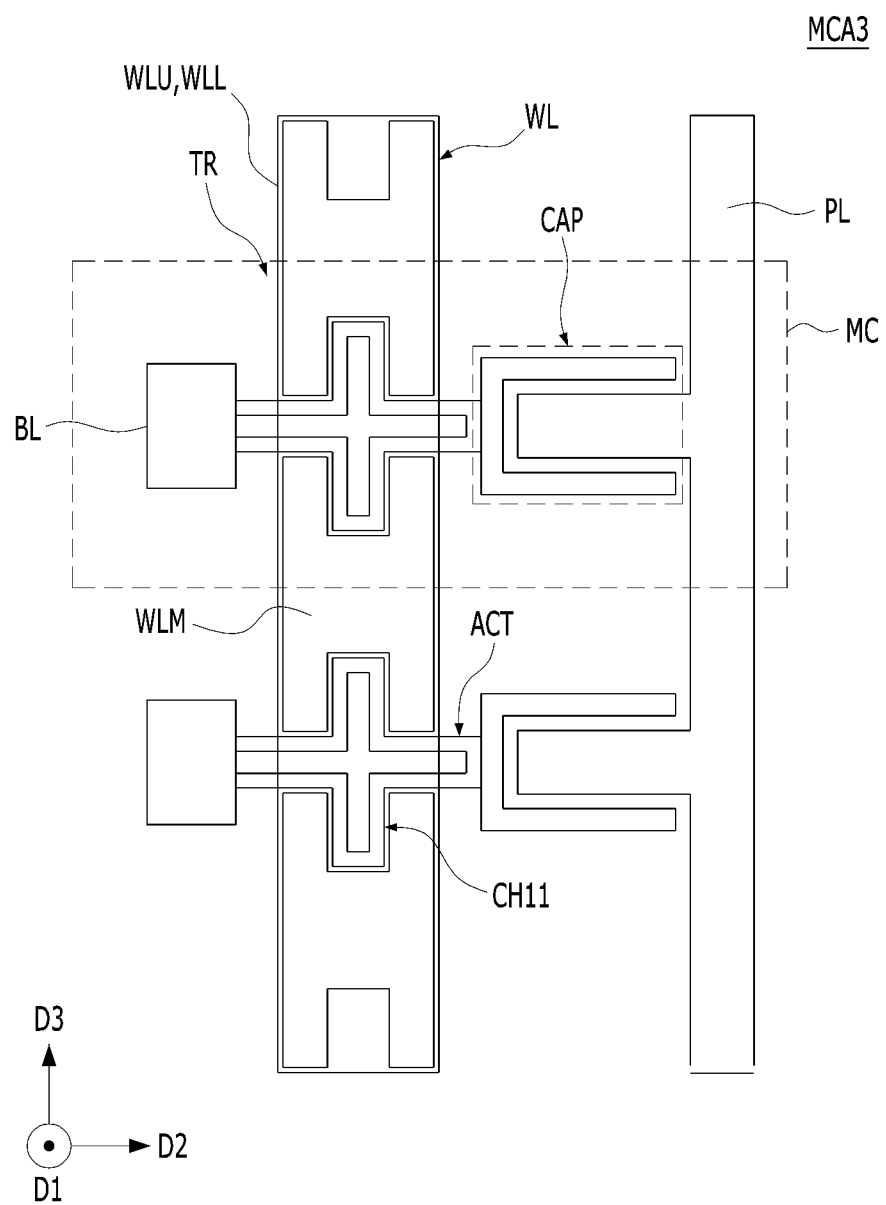
FIGS. 12 and 13 are layouts illustrating an example of a word line of a memory cell array.
Figure 13:
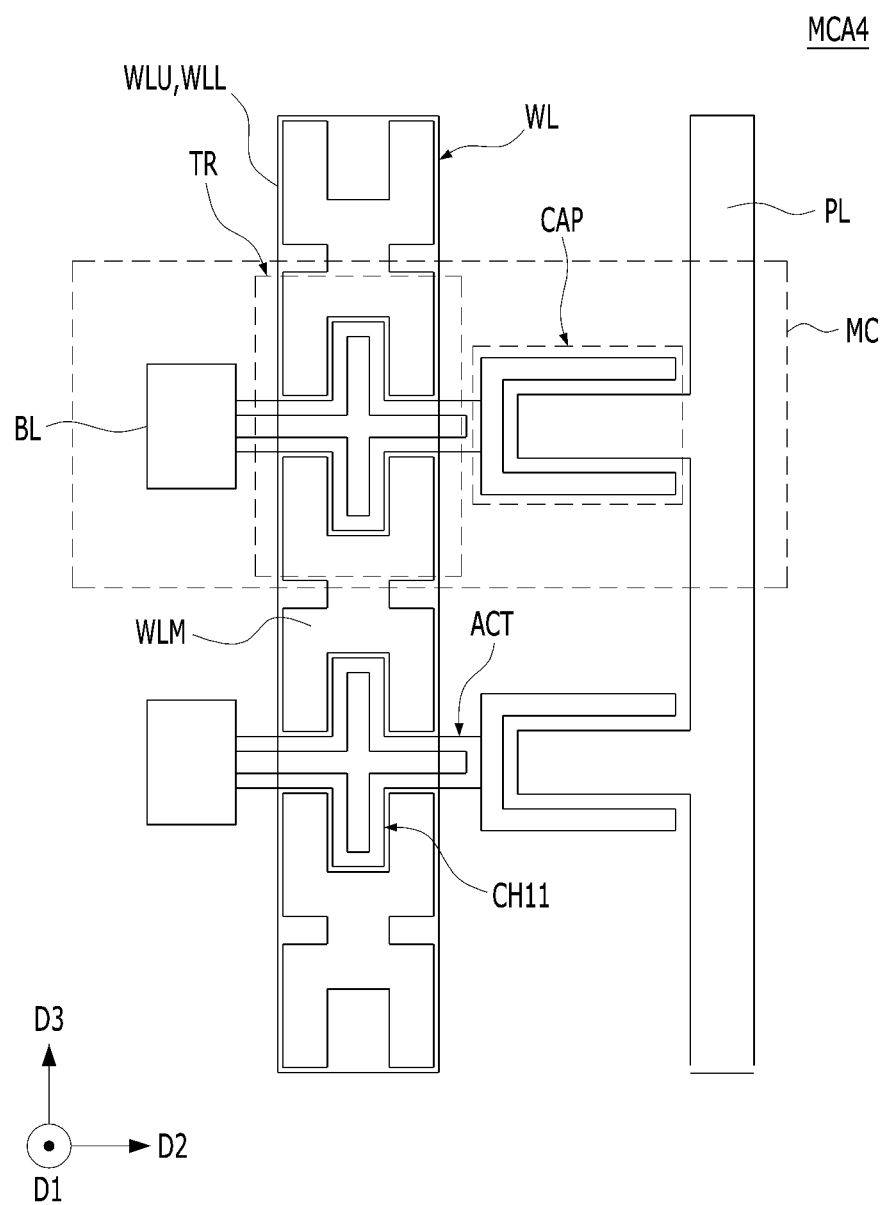

FIGS. 12 and 13 are layouts illustrating an example of a word line of a memory cell array.

Referring to FIGS. 8A, 8B, 8C, 12, and 13, each of the memory cell arrays MCA3 and MCA4 may include a word line WL, and the word line WL may extend in the third direction D3 while surrounding the cross-type channel layer CH11 of a cross-type active layer ACT. The memory cells MC that are laterally arranged in the third direction D3 may share the word line WL.

The word line WL may include an upper level portion WLU, an intermediate level connection WLM, and a lower level portion WLL. The upper level portion WLU may be positioned at a higher level than the cross-type channel layer CH, and the lower level portion WLL may be positioned at a lower level than the cross-type channel layer CH11. The intermediate level connection WLM may be positioned between the upper level portion WLU and the lower level portion WLL, and may have the same height as the height of the cross-type channel layer CH11. The intermediate level connection WLM may be positioned between the cross-type channel layers CH11 that are laterally arranged in the third direction D3. The upper level portion WLU and the lower level portion WLL may extend in the third direction D3. The intermediate level connection WLM may surround the sides of the branch portions (refer to 'C2 and C3' in FIG. 8C) of the cross-type channel layer CH11.

The intermediate level connections WLM of FIGS. 12 and 13 may be formed as the intermediate level connections between the cross-type active layers CH11 arranged in the third direction D3 are coupled to each other. For example, the intermediate level connections may be coupled to form an 'H'-shaped intermediate level connection between the neighboring cross-type channel layers CH11 in the third direction D3. The intermediate level connection WLM of FIG. 13 may have a 'modified H-shape' and it may be formed by thinning the central portion of the H shape shown in FIG. 12 in the second direction D2.

In FIGS. 12 and 13, an isolating material (not shown) such as silicon oxide may be formed between the neighboring bit lines BL in the third direction D3. The isolating material may extend to be positioned on both sides of the intermediate level connection WLM.

The memory cell arrays MCA, MCA1, and MCA2 of FIGS. 9A, 10, and 11 may be positioned over the substrate LS including the peripheral circuit portion PC. Accordingly, the memory cell arrays MCA, MCA1, and MCA2 may have a Peri-Under-Cell (PUC) structure. In the PUC structure, the bit line BL may be vertically oriented upwardly from the substrate LS.

According to another embodiment of the present invention, the memory cell arrays MCA, MCA1 and MCA2 may be positioned below the substrate LS including the peripheral circuit unit PC, which may be referred to as a Cell-Under-Peri (CUP) structure or Peri-Over-Cell (POC) structure. In the CUP structure, the bit line may be vertically oriented downwardly from the substrate LS.

The memory cell arrays MCA, MCA1, and MCA2 according to the above-described embodiments of the present invention may provide a 3D DRAM cell array in which memory cells including one transistor and one capacitor are vertically stacked.

Although not illustrated, according to yet another embodiment of the present invention, the memory device may include a first semiconductor substrate and a second semiconductor substrate bonded to the first semiconductor substrate. The memory cell array may be formed over the first semiconductor substrate, and the peripheral circuit portion may be formed over the second semiconductor substrate. Each of the first semiconductor substrate and the second semiconductor substrate may include conductive bonding pads, and the first semiconductor substrate and the second semiconductor substrate may be bonded through the conductive bonding pads. Accordingly, the memory cell array and the peripheral circuit portion may be electrically connected.

According to another embodiment of the present invention, as illustrated in FIG. 9B, the memory device may include a substrate LS including a peripheral circuit portion PC, an active layer ACT including a nano-wire channel CH which is spaced apart from the substrate LS and laterally oriented in the second direction D2, a word line WL laterally oriented in the third direction D3 crossing the second direction while surrounding the nano-wire channel CH, a bit line BL coupled to an end of one side of the active layer ACT and vertically oriented in the first direction D1 from the peripheral circuit portion PC, and a lateral capacitor CAP coupled to an end of the other side of the active layer ACT and spaced apart from the substrate LS.

According to another embodiment of the present invention, as illustrated in FIGS. 4 to 7D, the surrounding portion SWL may be referred to as a gate, and extended portions EWL and EWL' may be referred to as lateral word lines. Hereinafter, this may be described with reference to FIG. 14.

Figure 14:
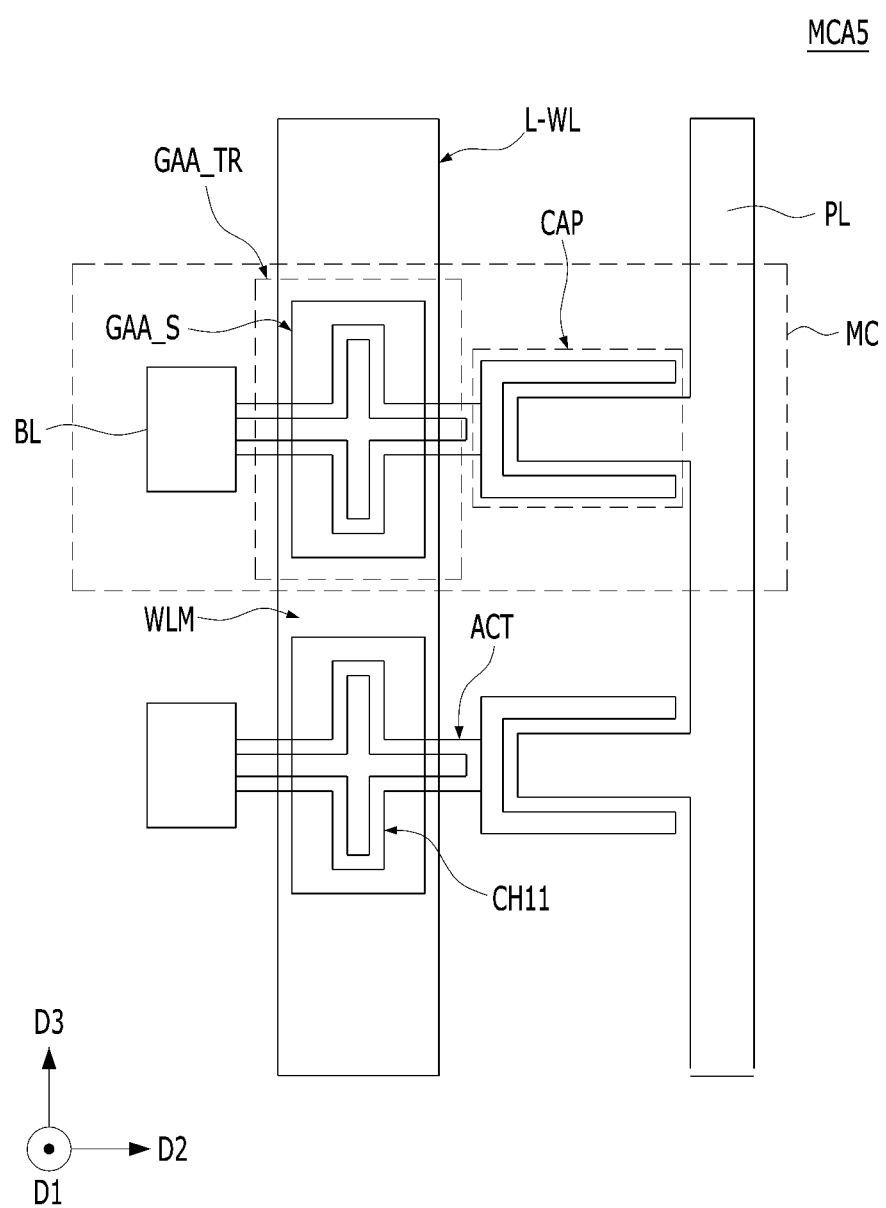
FIG. 14 is a layout illustrating a memory cell array in accordance with another embodiment of the present invention.

FIG. 14 is a layout illustrating a memory cell array MCA5 in accordance with another embodiment of the present invention.

Referring to FIG. 14, a memory cell array MCA5 may include a plurality of memory cells MC. Each memory cell MC may include a gate-all-around transistor GAA_TR, a bit line BL coupled to a first source/drain region SD1 of the gate all-around transistor GAA_TR, a capacitor CAP coupled to a second source/drain region SD2 of the gate all-around transistor GAA_TR, and a lateral word line L_WL coupled to a gate GAA_S of the gate all-around transistor GAA_TR. The gates GAA_S of the gate all-around transistors GAA_TR positioned at the same level in the third direction D3 may be coupled to one lateral word line L-WL. The bit line BL may be vertically oriented in the first direction D1, and the active layer ACT including the cross-type channel layer CH11 of the gate all-around transistor GAA_TR may be laterally oriented in the second direction D2. The lateral word line L-WL may include an intermediate level connection WLM for coupling the neighboring gates GAA_S to each other. The intermediate level connection WLM may have an 'H' shape.

According to the embodiment of the present invention, the integration degree of a 3D memory device may be improved by stacking transistors and capacitors over a substrate in three dimensions.

While the present invention has been described with respect to specific embodiments, it will be apparent to those skilled in the art that various changes and modifications may be made without departing from the spirit and scope of the invention as defined in the following claims.

What is claimed is:

1. A memory device, comprising:
   a substrate;
   a cross shape active layer spaced apart from a surface of the substrate and laterally oriented in a first direction, and including a first side, a second side, and a channel layer between the first side and the second side; and
   a word line laterally oriented in a second direction crossing the first direction while surrounding the channel layer.

2. The memory device of claim 1, wherein the cross shape active layer is configured as a laterally oriented cylinder shape with an inner gap.

3. The memory device of claim 2, further comprising a gap-fill material filling the inner gap.

4. The memory device of claim 3, wherein the cross shape active layer includes:
   a first source/drain region surrounding an end of one side of the gap-fill material; and
   a second source/drain region surrounding an end of another end of the gap-fill material.

5. The memory device of claim 1, wherein the cross shape active layer includes a silicon layer, InGaZnOx, InSnZnOx, ZnSnOx, MoS2, WS2 or MoSe2.

6. The memory device of claim 1, wherein the word line includes:
   a surrounding portion surrounding the channel layer; and
   extended portions extending in the second direction from both sides of the surrounding portion.

7. The memory device of claim 1, wherein the word line includes:
   an upper level portion positioned at a higher level than the channel layer;

a lower level portion positioned at a lower level than the channel layer; and an intermediate level connection positioned between the upper level portion and the lower level portion while being positioned at the same level as the channel layer.

8. The memory device of claim 1, wherein the channel layer has a cross-type.

9. The memory device of claim 1, further comprising:
a bit line coupled to the first side of the cross shape active layer and vertically oriented with respect to the substrate; and
a capacitor coupled to the second side of the cross shape active layer.

10. The memory device of claim 1, wherein the substrate including a peripheral circuit portion.

* * * * *